United States Patent [19]

Schädeli et al.

[11] Patent Number: 6,010,567

[45] Date of Patent: Jan. 4, 2000

[54] BLACK-PIGMENTED STRUCTURED HIGH MOLECULAR WEIGHT MATERIAL

[75] Inventors: Ulrich Schädeli, Hockessin, Del.; Eric Tinguely, Fribourg, Switzerland; Véronique Hall-Goulle, Reinach, Switzerland; Gerardus de Keyzer, Riehen, Switzerland

[73] Assignee: Ciba Specialty Chemicals Corporation, Tarrytown, N.Y.

[21] Appl. No.: 09/057,090

[22] Filed: Apr. 8, 1998

[30] Foreign Application Priority Data

| Apr. 9, 1997 | [CH] | Switzerland | 0822/97 |
| Apr. 9, 1997 | [CH] | Switzerland | 0823/97 |
| Jun. 30, 1997 | [CH] | Switzerland | 1573/97 |
| Dec. 16, 1997 | [CH] | Switzerland | 2896/97 |

[51] Int. Cl.$^7$ ..................................................... C09B 67/50
[52] U.S. Cl. ..................... 106/413; 106/410; 106/411; 106/493; 106/494; 106/495; 106/496; 106/497; 106/498; 106/499; 523/200
[58] Field of Search ........................... 106/410, 411, 106/413, 493, 494, 495, 496, 497, 498, 499; 523/200

[56] References Cited

U.S. PATENT DOCUMENTS

| 5,268,245 | 12/1993 | Chiulli .................................. 430/7 |
| 5,811,543 | 9/1998 | Hao et al. ........................... 540/123 |
| 5,830,267 | 11/1998 | Zambounis et al. ................. 106/413 |
| 5,840,449 | 11/1998 | Zambounis et al. ..................... 430/7 |
| 5,879,855 | 3/1999 | Schadeli et al. .................. 430/270.1 |

FOREIGN PATENT DOCUMENTS

| 0654711 | 5/1995 | European Pat. Off. . |
| 0720201 | 7/1996 | European Pat. Off. . |
| 0742255 | 11/1996 | European Pat. Off. . |
| 0761772 | 3/1997 | European Pat. Off. . |

OTHER PUBLICATIONS

Kudo et al, Journal of Photopolymer Science and Technology, 9/1, 109–120 (1996) (No Month available).
Patent Abstracts of Japan No. 08082928 (Mar. 1996).
Chemical Abstract, JP–08/44050 (Feb. 1996).
Displays, 14/2, 115 (1993), Tsuda (No Month Available).
Journal of the SID 1/3, 341–346 (1993), Sugiura (No Month Available).

*Primary Examiner*—Mark L. Bell
*Assistant Examiner*—Scott L. Hertzog
*Attorney, Agent, or Firm*—Kevin T. Mansfield; David R. Crichton

[57] ABSTRACT

This invention relates to a black-pigmented high molecular weight organic material which is structured from a radiation-sensitive precursor by irradiation, the pigmentation of which material consists of coloured organic pigments, at least one of which is in latent form before irradiation. This material is preferably used as a thin layer which is built up in the form of patterns on a transparent substrate and which can be used, for example, as black matrix for optical colour filters. This invention also relates to a process for the preparation of this material as well as to novel soluble derivatives of yellow disazo condensation pigments which can be used in this process.

23 Claims, No Drawings

BLACK-PIGMENTED STRUCTURED HIGH MOLECULAR WEIGHT MATERIAL

The present invention relates to a black-pigmented high molecular weight organic material structured from a radiation-sensitive precursor by irradiation, the pigmentation of which material consists of coloured organic pigments, at least one of which is in latent form before irradiation. This material is preferably used as thin layer which is built up in the form of patterns on a transparent substrate and which can be used, for example, as black matrix for optical colour filters. This invention also relates to a process for the preparation of this material as well as to novel soluble derivatives of yellow disazo condensation pigments which can be used in said process.

Colour filters constitute an extremely exacting technology which makes very high demands on the colourants also. Different pigmentation processes for producing colour filters which are, in principle, fundamentally different are known. A number of variants thereof are described in Displays 14/2, 115 (1993). In addition to the three basic colours, a black patterned layer is also important, the absorption of which is said to be from 3.0 to 3.5.

A first possibility consists in the use of chromium, the reflection of which in metallic form, however, is undesirably high. It is also possible to use chromium compounds, for example chromium dioxide, but the process this requires is very complex and elaborate. The heavy metal chromium is furthermore undesirable for ecological reasons.

On the other hand it is possible to use dyes which can be completely dissolved in a binder, in a customary solvent or in a solution of the binder in a customary solvent. The black soluble dye used is usually C.I. Solvent Black 3. However, the low heat-stability and insufficient opacity of black dyes are disadvantageous as are also in general the high costs of this technology.

Finally, it is also possible to use dispersions of pigments which are completely insoluble, or soluble only in extremely low concentration, in a binder or in a customary solvent. A number of variants of that method are disclosed in Journal of the SID 1/3, 341–346 (1993) and at the IDW'95 (contribution CF-3, pages 57–60 of the printed version). Because of the desired uniformly thin coating, a particularly fine particle size is required which corresponds to a very high specific surface.

However, radiation-sensitive compositions pigmented black with mixtures of coloured pigments, such as Disazo Pigment Yellow 83, Phthalocyanine Pigment Blue 15:6, Phthalocyanine Pigment Green 36, Dioxazine Pigment Violet 23 and Anthraquinone Pigment Red 177, give black layers of still unsatifactory opacity and heat-stability. According to Journal of Photopolymer Science and Technology 9/1, 121–130 (1996), better results are allegedly obtained when using carbon black instead of coloured organic pigments.

Disadvantages of the pigment dispersions are that the resolution that is possible does not satisfy the highest requirements and the use of radiation-sensitive formulations results in release of pigment particles which form solid residues both on the black matrix itself and in the apparatus. Moreover, as disclosed in Solid State Technology S15–S18 (11/1992), pigments cause light-scattering with the result that the sensitivity of the formulations is reduced and the edges of the patterns become unsharp. This has particularly markedly disadvantageous results in the base of black.

It is one object of this invention to provide a black pigmentation which is as free as possible of heavy metals, which consists of very fine particles and has high opacity even in a very thin layer as well as good stability against light, heat and/or the chemicals required for processing radiation-sensitive formulations.

Another object of this invention is to provide a process for the preparation of a black pigmentation starting from a radiation-sensitive formulation, wherein the resolution is very high and the patterns produced by the irradiation have sharp edges.

Surprisingly, it has been possible to reach these objectives to a high degree with the novel pigment formulations.

This invention relates to a structured pigmented high molecular weight organic material which is obtainable by irradiating a radiation-sensitive precursor, wherein the radiation-sensitive precursor
  comprises at least one dissolved pigment derivative which can be converted to a coloured organic pigment, and
  has a transmission of $\geq 10\%$, preferably of $\geq 20\%$, particularly preferably of $\geq 50\%$, at a wavelength in the range of at least 300 to 700 nm; and the structured material has a transmission of $\leq 5\%$, preferably of $\leq 2\%$ throughout the entire range from 400 to 700 nm either in those places exposed to irradiation or in those not exposed to irradiation.

Depending on the use of a negative or positive photoresist, if is possible to make structured materials wherein the pigmented areas are either at the places exposed or at those not exposed to irradiation. Structured materials made from negative photoresists are preferred.

The coloured organic pigment is, for example, a quinacridone, anthraquinone, perylene, indigo, quinophthalone, isoindolinone, isoindoline, dioxazine, phthalocyanine, diketopyrrolopyrrole or azo pigment. Preferably, the pigment is from the group consisting of diketopyrrolopyrrole, dioxazine, disazo, benzimidazoloneazo, isoindoline, isoindolinone and phthalocyanine pigments. The pigment preferably contains at least 2 —NHCO— groups, particularly preferably at least 4 —NHCO— groups.

Preferred pigments are pyrrolo[3,4-c]pyrroles of formula

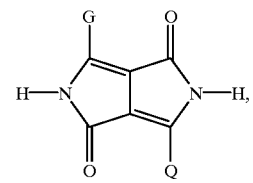

(I)

wherein G and Q are each independently of the other a group of formula

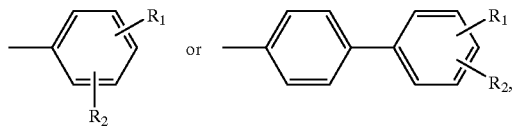

and $R_1$ and R2 are each independently of the other hydrogen, halogen, cyano, carbamoyl, nitro, trifluoromethyl, phenyl, $C_1$–$C_6$alkyl, $C_1$–$C_6$alkoxy, $C_1$–$C_6$alkylthio or $C_1$–$C_6$alkylamino;

dioxazines of formula (II)

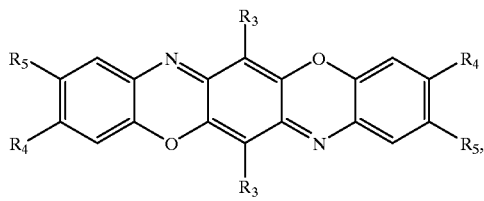

wherein $R_3$, $R_4$ and $R_5$ are each independently of one another hydrogen, halogen, $C_1$–$C_4$alkyl, $C_1$–$C_4$alkoxy, NHCOC$_1$–C$_4$alkyl or NHCOphenyl, at least 1 of the radicals $R_3$, $R_4$ and $R_5$ being NHCOC$_1$–C$_4$alkyl or NHCOphenyl; isoindolines of formula

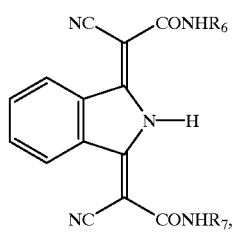 (III)

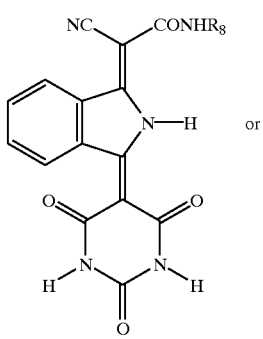 (IV)

or

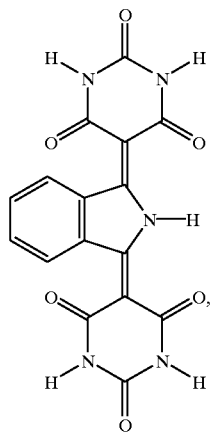 (V)

wherein $R_6$ is a 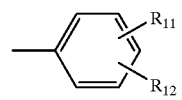 group, $R_7$ is hydrogen, $C_1$–$C_6$alkly benzyl or a

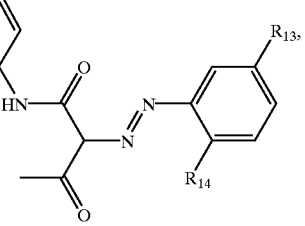

group, $R_8$ is hydrogen or $R_6$, and $R_9$, $R_{10}$, $R_{11}$ and $R_{12}$ are each independently of one another hydrogen, $C_1$–$C_6$alkyl, $C_1$–$C_6$alkoxy, halogen or trifluoromethyl;

disazos of formula

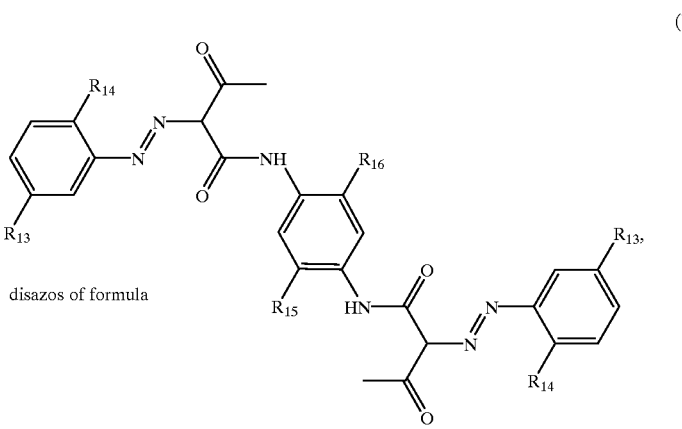 (VI)

wherein $R_{13}$ and $R_{14}$ are each independently of the other hydrogen, chloro, $CONHR_{17}$ or $SO_2NHR_{17}$, $R_{13}$ is preferably $CONHR_{17}$ and $R_{14}$ is preferably chloro, $R_{15}$ and $R_6$ are hydrogen, chloro or methyl, preferably chloro or methyl, and $R_{17}$ is phenyl or oxybisphenylyl, each of which is unsubstituted or substituted by 1 to 3, preferably by 2, substituents selected from the group consisting of chloro, trifluoromethyl, methoxy and methyl, $R_{17}$ is preferably phenyl or oxybisphenylyl, each of which is substituted by 2 substituents selected from the group consisting of chloro, trifluoromethyl and methyl;

benzimidazoloneazos of formula (VIIa)

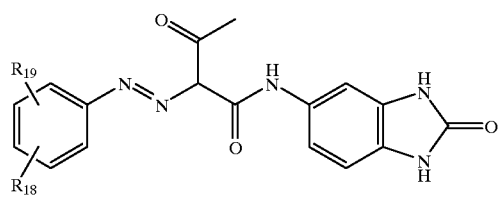

or (VIIb)

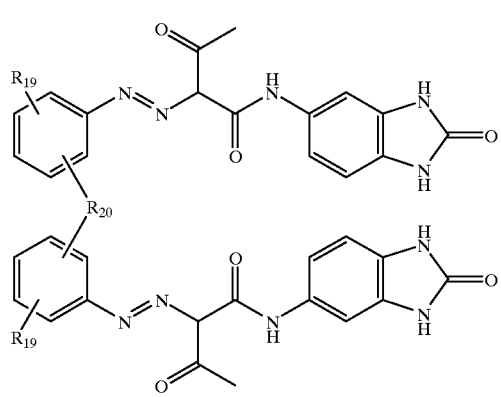

wherein $R_{19}$ and $R_{18}$ are each independently of the other hydrogen, halogen, nitro, $C_1$–$C_6$alkoxy, trifluoromethyl, $C_1$–$C_6$alkyl, carboxy, $C_1$–$C_6$alkoxycarbonyl or $CONHR_{21}$, $R_{20}$ is a direct bond, oxygen, sulfur, $C_1$–$C_6$alkylene or O—$C_2$–$C_6$alkylene—O, and $R_{21}$ is hydrogen, $C_1$–$C_6$alkyl or phenyl which is unsubstituted or substituted by halogen, nitro, $C_1$–$C_6$alkoxy, trifluoromethyl, $C_1$–$C_6$alkyl, carboxy, $C_1$–$C_6$alkoxycarbonyl or $CONH_2$;

isoindolinones of formula (VIIIa)

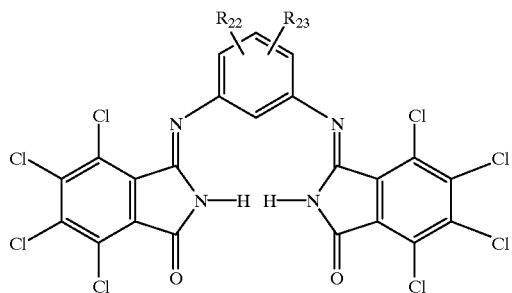

or (VIIIb)

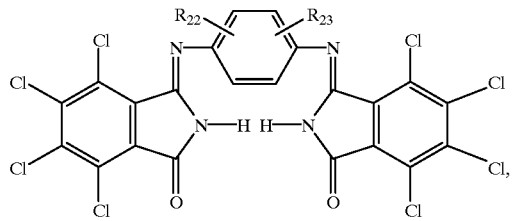

wherein $R_{22}$ and $R_{23}$ are each independently of the other hydrogen, halogen or $C_1$–$C_6$alkyl; and phthalocyanines of formula (IX)

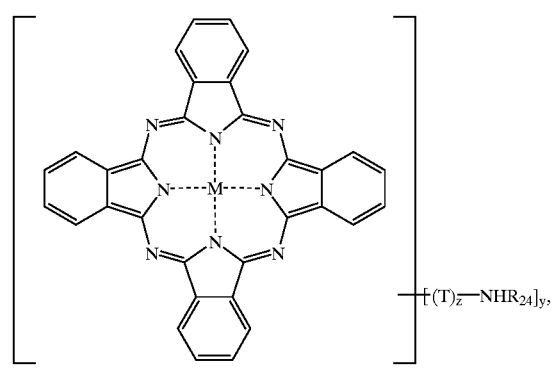

wherein M is $H_2$, a divalent metal selected from the group consisting of Cu(II), Zn(II), Fe(II) Ni(II) and Pd(II), or a divalent oxometal selected from the group consisting of V(O), Mn(O) and Ti(O), T is —$CHR_{25}$—, —CO— or —$SO_2$—, $R_{24}$ is hydrogen, $C_1$–$C_6$alkyl, $NH_2$, $NHCOR_{26}$, —$COR_{26}$ or

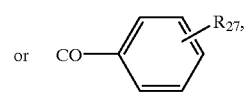

$R_{25}$ is hydrogen or $C_1$–$C_6$alkyl, $R_{26}$ is $C_1$–$C_6$alkyl, $R_{27}$ is hydrogen, halogen, $C_1$–$C_6$alkyl or $C_1$–$C_6$alkoxy, and z is zero or 1, and y is a number from 1 to 8, or phthalocyanine derivatives resulting from thermal or photochemical degradation of phthalocyanines of formula (IX).

Particularly preferred pigments are pyrrolo[3,4-c]pyrroles of formula (X)

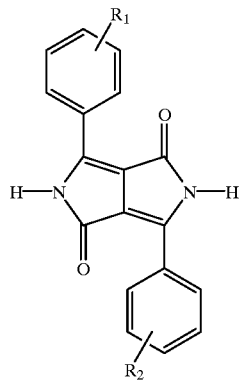

wherein $R_1$ and $R_2$ are each independently of the other hydrogen, halogen, cyano, carbamoyl, nitro, trifluoromethyl, phenyl, $C_1$–$C_6$alkyl or $C_1$–$C_6$alkoxy;

dioxazines of formula (XI)

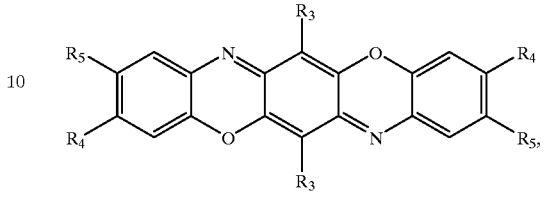

wherein $R_3$, $R_4$ and $R_5$ are each independently of one another $C_1$–$C_4$alkoxy, NHCOC$C_1$–$C_4$alkyl or NHCOphenyl, at least 1 of the radicals $R_3$, $R_4$ or $R_5$ being NHCOC$_1$–$C_4$alkyl or NHCOphenyl;

isoindoline of formula (XII)

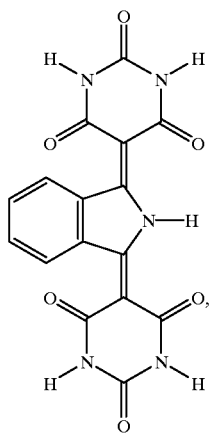

disazos of formula (XIII)

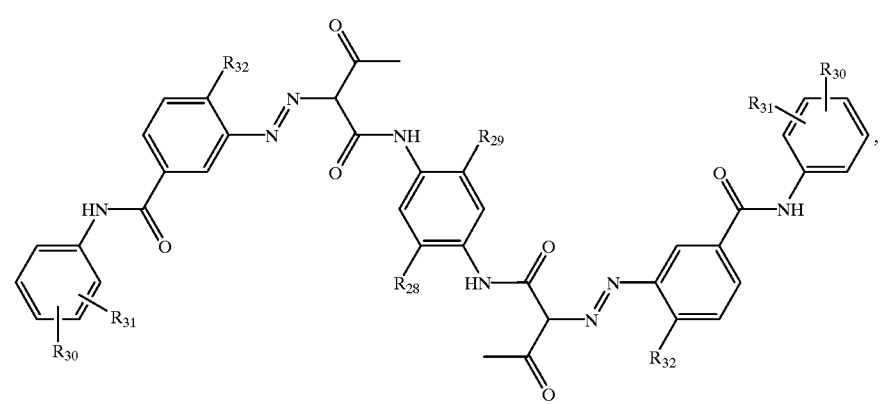

wherein $R_{28}$ and $R_{29}$ are each independently of the other hydrogen, chloro or methyl, preferably chloro or methyl, $R_{28}$ is particularly preferably chloro and $R_{29}$ is particularly preferably methyl, $R_{30}$ and $R_{31}$ are each independently of the other hydrogen, chloro, methyl, trifluoromethyl, methoxy, or phenoxy which is unsubstituted or substituted by 1 or 2, preferably by 1, substituent selected from the group consisting of chloro, trifluoromethyl, methoxy and methyl, $R_{30}$ and $R_{31}$ are preferably each independently of the other chloro, methyl, trifluoromethyl, phenoxy or chlorophenoxy, $R_{30}$ is particularly preferably chloro or trifluoromethyl and $R_{31}$ is particularly preferably methyl or chlorophenoxy, and $R_{32}$ is hydrogen or chloro, preferably chloro;

benzimidazoloneazos of formula (XIV)

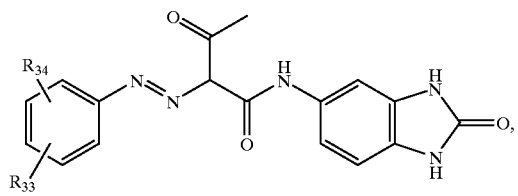

wherein $R_{34}$ and $R_{33}$ are each independently of the other hydrogen, chloro, methoxy, carboxy or methoxycarbonyl; and phthalocyanines of formula (XV)

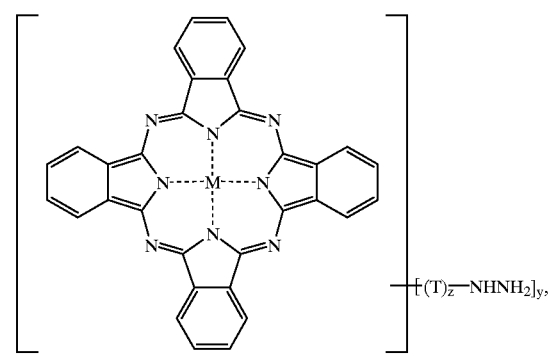

wherein M is $H_2$, a divalent metal selected from the group consisting of Cu(II), Zn(II), Fe(II) and Ni(II), T is —CO— or —SO$_2$—, and y is a number from 1 to 4.

Very particularly preferred are the pigments of formulae

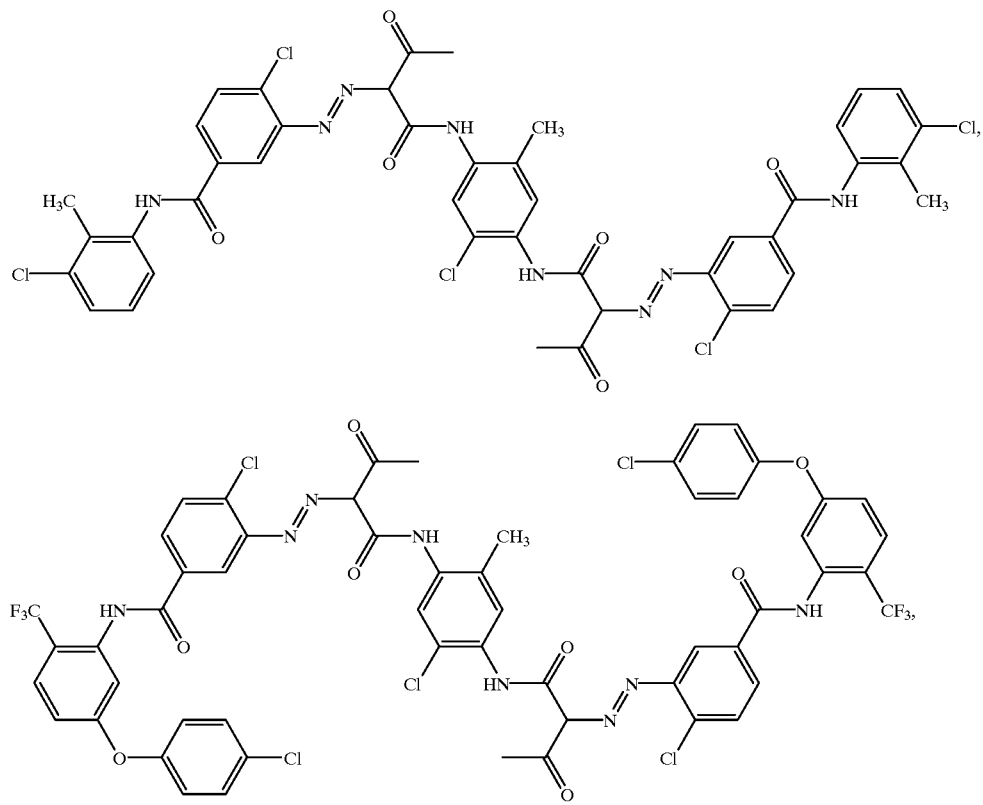

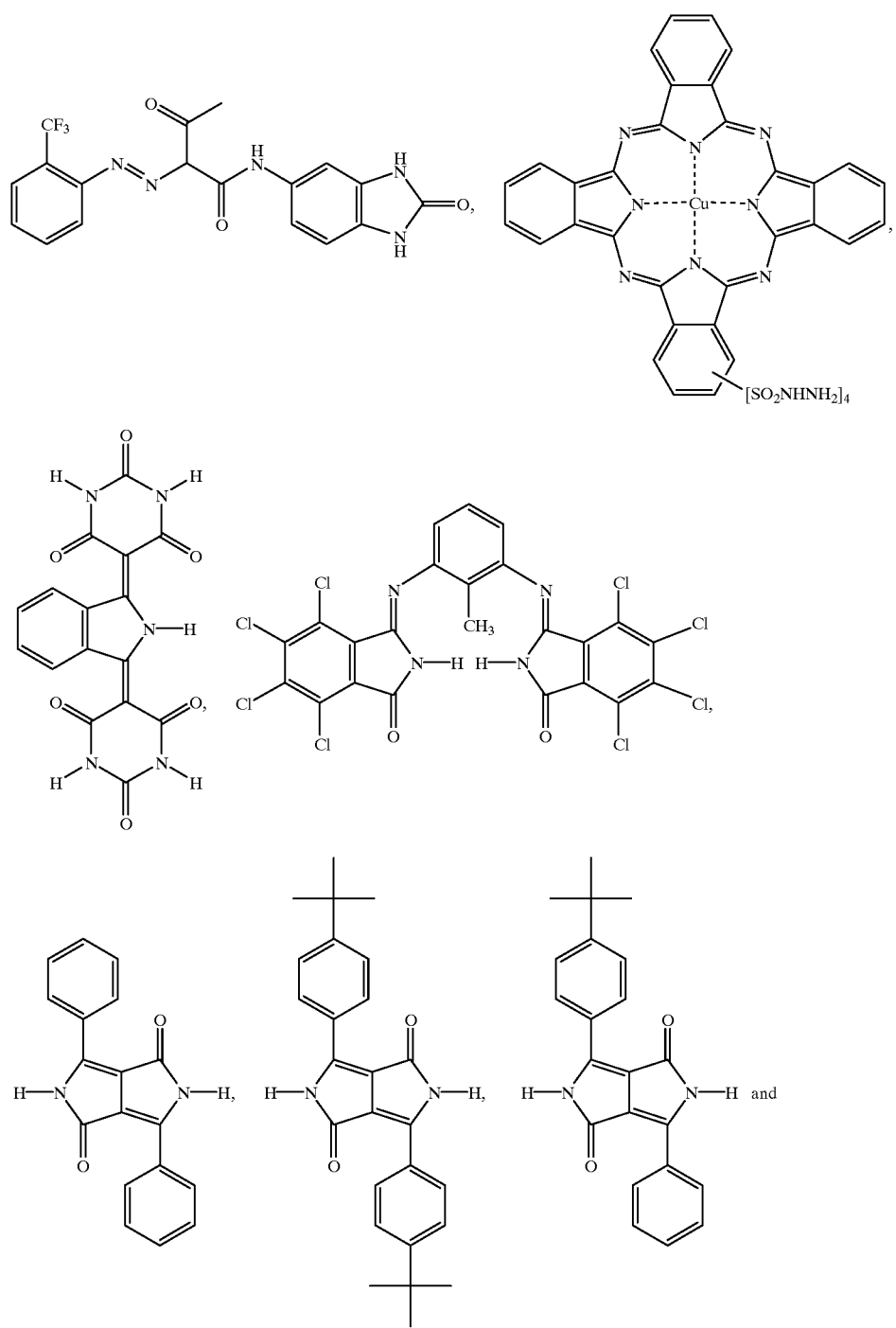

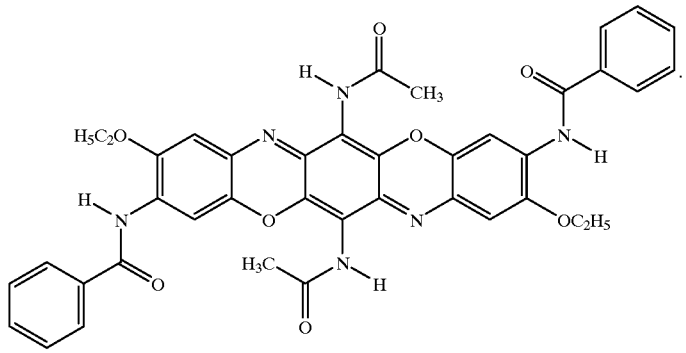

Alkyl may be straight-chain, branched or cyclic. $C_1$–$C_6$Alkyl is thus, for example, methyl, ethyl, n-propyl, isopropyl, n-butyl, sec-butyl, isobutyl, tert-butyl, cyclobutyl, n-pentyl, 2-pentyl, 3-pentyl, 2,2-dimethylpropyl, cyclopentyl, cyclohexyl or n-hexyl, preferably straight-chain or branched $C_1$–$C_4$alkyl.

$C_1$–$C_6$Alkoxy is O—$C_1$–$C_6$alkyl, preferably O–$C_1$–$C_4$alkyl.

Halogen is chloro, bromo, fluoro or iodo. Chloro or bromo are preferred.

The novel pigmented high molecular weight organic material structured by irradiation preferably comprises at least 5% by weight, particularly preferably at least 10% by weight, of pigment particles, based on the pigmented high molecular weight material. It very particularly preferably comprises 20 to 90% by weight of pigment particles, based on the pigmented high molecular weight material.

The pigmented material of this invention conveniently comprises two or more pigments, the colours of which are complementary. Colorations of two pigments of complementary colour preferably have a colour difference (Δh) of 150 to 210, preferably of 170 to 190 at a measuring angle of 10°. Where more than two pigments are present, the colour values of colorations of the pure pigments to be mixed should expediently be in at least two opposed quadrants of the a*b*-Colour Table (CIE-L*a*b*). Mixtures of complementary colours are distinguished by resulting in low colour saturation C* (CIE-L*C*h).

It is preferred to combine pyrrolo[3,4-c]pyrroles of formula (I) and/or dioxazines of formula (II) with disazos of formula (VI) and/or phthalocyanines. The phthalocyanines may be those of formula (IX) or also known types, such as unsubstituted or polyhalogenated, blue or green copper phthalocyanine pigments.

Pigment derivatives which can be dissolved in radiation-sensitive compositions are known, inter alia, from EP.654 711, EP 742 255, EP 761 772 and PCT/EP-98100248. These pigment derivatives are coloured organic pigments which are chemically altered such that they are completely soluble in a ready-for-use mixture of a binder and a customary solvent. For this invention it is important that the soluble pigment derivate can be converted to an insoluble coloured pigment after coating and customary further processing. Such pigment derivatives are therefore sometimes called "latent pigments".

It is necessary that at least part of at least one of the pigments is used in the form of a derivative which dissolves in the ready-for-coating formulation of the radiation-sensitive precursor. It is expedient that at least such an amount of a pigment should be in dissolved form that the coated radiation-sensitive precursor has a transmission of ≧10% at a wavelength in the range of at least 300 to 700 nm according to this invention. This spectral window can be utilised for structuring by irradiation. However, it is also possible to use several (for example from 2 to 5) pigments in the form of soluble derivatives. If required, the ready-for-coating formulation can comprise one or several pigments in the form of insoluble particles in addition to the soluble pigment derivatives.

Where appropriate, the remaining pigments can be obtained quite conventionally in the form of insoluble pigment particles which are very finely dispersed in the radiation-sensitive precursor. Very finely dispersed dispersions of pigments in radiation-sensitive precursor compositions can be obtained, for example, by the method described in JP-08/17911 1A.

However, it is preferred that as large as possible a proportion of the pigments is present in the radiation-sensitive precursor in the form of dissolved pigment derivatives, particularly preferably at least 30 mol %, more preferably at least 50 mol %, based on the sum of all pigments in the structured material. It is very particularly preferred that all pigments are used in the form of dissolved pigment derivatives in the radiation-sensitive precursor so that the latter essentially does not contain any undissolved pigment particles. The pigment derivatives should expediently be completely soluble in the ready-for-coating composition comprising the radiation-sensitive precursor as well as, if required, a solvent and possibly other additives.

High molecular weight organic materials are those having a molecular weight of about $10^5$ to $10^7$ g/mol.

The pigment particles in the novel structured material are extremely fine. They preferably have an average particle size of 0.01 to 1.0 μm, particularly preferably an average particle size of 0.01 to 0.1 μm. The average particle size is taken to be the maximum of the distribution curve of the particle size plotted by weight.

The novel pigmented high molecular weight organic material is preferably coated onto a transparent substrate in the form of a thin layer having a thickness of ≦5 μm, particularly preferably of ≦2 μm, very particularly preferably of ≦1 μm. The transparency of the substrate is preferably ≧95%, particularly preferably ≧98%, at a wavelength in the range of at least 300 to 700 nm. Preferably the substrate and also all the layers are smooth, the surface roughness thereof being particularly preferably ≦0.1 μm. For example, glass or polycarbonate films may be used as smooth substrates.

Further preferred properties of black matrices are known to the person skilled in the art and may be found, for example, in the relevant literature or in the publications already mentioned. In general, preference is given to the materials according to the invention in which the pigment particles are regenerated from their soluble derivatives during or after structuring. In the latter case, the environment of the pigment particles does not change anymore after their development and particularly high resolution and opacity are possible.

Structuring is effected by irradiation of a radiation-sensitive precursor, where appropriate with the aid of heat and/or chemicals during or after the irradiation. Structuring is to be understood as being a change in the physical properties, so that, for example, material that is insoluble in a particular liquid becomes soluble therein, or vice versa. The processes suitable for structuring vary greatly depending upon the material that is to be structured but are, however, known to the person skilled in the art for each known material that can be structured.

The terms "resists" and "photoresists" are often used for radiation-sensitive precursors that yield structured organic materials by irradiation. Very many such precursors are known to the person skilled in the art. They are of positive or negative type depending upon whether the precursor is rendered soluble or insoluble by the irradiation and, where applicable, by the subsequent treatment. For example, the solubility of polymers or polymer derivatives is altered by crosslinking, polymerisation or depolymerisation. The technology of resists is described in many publications and technical reference books, for example also in the context of latent pigments in EP 654 711.

Preferably the precursors that can be structured to form the organic materials according to the invention are the systems b 1) to b5), and especially b 10), disclosed in EP 654 711 A1, the main components of which are described on page 17/ line 16 to page 26/ line 1, and on page 26/ line 39 to page 29/ line 11. Within each category of resists, preference is given to those compounds which are given as preferred in EP 654 711.

The pigmented material according to the invention receives its final high molecular weight structure as a result of the irradiation and, where applicable, subsequent treatment, it being unimportant whether the irradiation was directed at the areas that remain or at the areas that have disappeared.

For the irradiation there may be used, for example, any broadband or monochromatic electromagnetic radiation, for example of a wavelength in the range from 250 to 1000 nm. The irradiation should usefully by carried out at least partially in that wavelength range where the radiation-sensitive precursor has a transmission of ≧10%. The irradiation is preferably effected at 250 to 1000 nm, particularly preferably at 300 to 700 nm. Very particularly preferably, the irradiation is effected at or near that wavelength in the range from 300 to 700 nm where, because of the transmission, the most photons can reach the depth of the material. The irradiation is preferably effected through a mask so that irradiation occurs only in places, which consequently results in patterns.

The subsequent treatment carried out where applicable is one of the known customary after-treatments, such as thermal curing or a treatment using a developing bath.

Accordingly, this invention also relates to a process for the preparation of a patterned black matrix, which comprises
structuring a composition, which is coated on a transparent substrate and which has a transmission of ≧10% at a wavelength in the range from 300 to 700 nm and which comprises a radiation-sensitive precursor and a dissolved pigment derivative which can be converted to a coloured organic pigment, by irradiating this composition in places at said wavelength and, if required, by additional thermal treatment;

treating the coating with a developer after structuring, such that essentially only high molecular weight organic material remains on the substrate either at the places exposed or not exposed to the irradiation; and converting the pigment derivative thermally, photochemically and/or by acid- or base-catalysation to a coloured organic pigment during or after structuring, such that the high molecular weight organic material remaining on the substrate has a transmission of ≦5% in the entire range from 400 to 700 nm.

The soluble pigment derivatives can be prepared in accordance with or analogously to methods known per se as described, inter alia, in EP 648 770, EP 648 817, EP 654 711, EP 742 255 and PCT/EP-98/00248. For example, a pigment of the class diketopyrrolopyrrole, dioxazine, disazo, isoindoline, isoindolinone or phthalocyanine, each containing from 1 to 6 —NHCO— groups, can be reacted in the desired molar ratio with a pyrocarbonic acid diester of formula

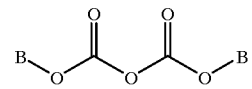

in an aprotic organic solvent in the presence of a base as catalyst, conveniently in the temperature range from 0 to 120° C., preferably from 10 to 100° C., for 2 to 80 hours.

The molar ratio in each case depends upon the number of radicals B to be introduced. The dicarbonate is expediently used in equimolar amount or in slight excess, for example 100 to 150 mol %, based on the hydrogen atoms to be substituted.

Suitable aprotic organic solvents are, for example, ethers, such as tetrahydrofuran or dioxane, or glycol ethers, such as ethylene glycol methyl ether, ethylene glycol ethyl ether, diethylene glycol monomethyl ether or diethylene glycol monoethyl ether, and dipolar aprotic solvents, such as acetonitrile, benzonitrile, N,N-dimethylformamide, N,N-dimethylacetamide, nitrobenzene, N-methylpyrrolidone, halogenated aliphatic or aromatic hydrocarbons, such as trichloroethane, benzene or alkyl-, alkoxy- or halo- substituted benzene, such as toluene, xylene, anisole or chlorobenzene, or aromatic N-heterocycles, such as pyridine, picoline or quinoline. Preferred solvents are, for example, tetrahydrofuran, N,N-dimethylformamide, N-methylpyrrolidone. The mentioned solvents can also be used in the form of mixtures. Advantageously, 5–20 parts by weight of solvent are used per 1 part by weight of reactants.

Bases suitable as catalyst are, for example, the alkali metals themselves, such as lithium, sodium or potassium and the hydroxides and carbonates thereof, or alkali metal amides, such as lithium, sodium or potassium amide, or alkali metal hydrides, such as lithium, sodium or potassium hydride, or alkaline earth metal or alkali metal alcoholates derived especially from primary, secondary or tertiary aliphatic alcohols having from 1 to 10 carbon atoms, such as lithium, sodium or potassium methylate, ethylate, n-propylate, isopropylate, n-butylate, sec-butylate, tert-butylate, 2-methyl-2-butylate, 2-methyl-2-pentylate, 3-methyl-3-pentylate, 3-ethyl-3-pentylate, and organic aliphatic, aromatic or heterocyclic N-bases, including, for example, diazabicyclooctene, diazabicycloundecene and 4-dimethylaminopyridine and trialkylamines, for example trimethylamine or triethylamine. It is also possible, however, to use a mixture of the mentioned bases.

Preference is given to the organic N-bases, for example diazabicyclooctane, diazabicycloundecene and especially 4-dimethylaminopyridine.

It is especially preferred to carry out the reaction at temperatures from 18 to 40° C. and at a pressure from 0.8 to 1.2 bar, especially of approximately 1 bar.

The suitable pyrocarbonic acid diesters of formula

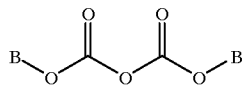

can be prepared analogously to generally known methods. Most of the chemicals required for that purpose are known. Many are commercially available and all of them can be prepared in accordance with methods known per se.

In the case of reaction of a pigment that contains from 1 to 6 —NHCO— groups with a pyrocarbonic acid diester of formula

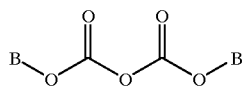

soluble pigment derivatives that contain from 1 to 6

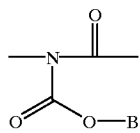

groups are produced, depending on the stoichiometry. It is not, however, necessary for all of the hydrogen atoms of the —NHCO— groups to be replaced by $CO_2B$. On the contrary, if more than one —NHCO— group is present in the pigment it is often advantageous for some of the —NHCO— groups to remain unchanged.

On the other hand it is also possible that groups other than —NHCO— react with the pyrocarbonic acid diester. Thus it is possible, for example, that —NH—$CO_2B$, —O—$CO_2B$ or —S—$CO_2B$ are formed from amino, hydroxyl or mercapto groups without any disadvantageous results to be feared since these groups can be split off under similar conditions as the

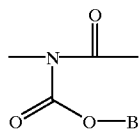

groups to form the pigment.

B may be any group that is known for solubilising pigments. Preferably, however, —B is a group of formula

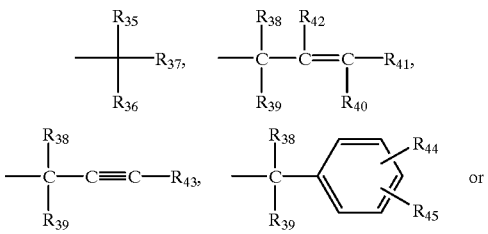

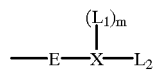

wherein $R_{35}$, $R_{37}$ and $R_{36}$ are each independently of one another $C_1$–$C_6$alkyl, $R_{38}$ and $R_{39}$ are each independently of the other $C_1$–$C_6$alkyl; $C_1$–$C_6$alkyl which is interrupted by O, S or $N(R_{46})_2$; phenyl or biphenyl, each of which is unsubstituted or substituted by $C_1$–$C_6$alkyl, $C_1$–$C_6$alkoxy, halogen, cyano or nitro, $R_{40}$, $R_{41}$ and $R_{42}$ are each independently of one another hydrogen or $C_1$–$C_6$alkyl, $R_{43}$ is hydrogen, $C_1$–$C_6$alkyl or a group of formula

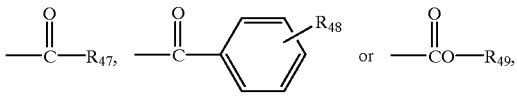

$R_{44}$ and $R_{45}$ are each independently of the other hydrogen, $C_1$–$C_6$alkyl, $C_1$–$C_6$alkoxy, halogen, cyano, nitro, $N(R_{46})_2$; phenyl which is unsubstituted or substituted by halogen, cyano, nitro, $C_1$–$C_6$alkyl or $C_1$–$C_6$alkoxy, $R_{46}$ and $R_{47}$ are $C_1$–$C_6$alkyl, $R_{48}$ is hydrogen or $C_1$–$C_6$alkyl, and $R_{49}$ is hydrogen, $C_1$–$C_6$alkyl, unsubstituted or $C_1$–$C_6$alkyl-substituted phenyl, E is p,q-$C_2$–$C_6$alkylene which is unsubstituted or mono- or polysubstituted by $C_1$–$C_6$alkoxy, $C_1$–$C_6$alkylthio or by $C_2$–$C_{12}$dialkylamino, wherein p and q are different position numbers, X is a hetero atom selected from the group consisting of N, O and S; and, when X is O or S, m is zero and, when X is N, m is 1, and $L_1$ and $L_2$ are each independently of the other $C_1$–$C_6$alkyl or [—(p',q'-$C_2$–$C_6$alkylene)—Z—]$_n$—$C_1$–$C_6$alkyl, each of which is unsubstituted or mono- or polysubstituted by $C_1$–$C_6$alkoxy, $C_{1-6}$alkylthio, $C_2$–$C_{12}$dialkylamino, $C_6$–$C_{12}$aryloxy, $C_{6-12}$arylthio, $C_{7-18}$arylalkylamino or by $C_{12-24}$diarylamino, wherein n is a number from 1 to 1000, p' and q' are different position numbers, each Z is independently of the others a hetero atom O, S or $C_{1-12}$alkyl-substituted N, and $C_{2-6}$alkylene in the repeating units [—$C_2$–$C_6$alkylene—Z—] may be identical or different, and $L_1$ and $L_2$ may be saturated or from mono- to deca-unsaturated, uninterrupted or interrupted at any position(s) by from 1 to 10 groups selected from the group consisting of —(C=O)— and —$C_6H_4$—, and may have no substituents or from 1 to 10 further substituents selected from the group consisting of halogen, cyano and nitro.

$C_{2-6}$Alkylene is, for example, 1,2-ethylene, 1,2-propylene, 1,3-propylene, 1,2-butylene, 1,3-butylene, 2,3-butylene, 1,4-butylene, 2-methyl-1,2-propylene or an isomer of pentylene or hexylene.

$C_{6-12}$Aryloxy is O—$C_6$-$C_{12}$aryl, for example phenoxy or naphthoxy, preferably phenoxy.

$C_1$-$C_6$Alkylthio is S—$C_{1-6}$alkyl, preferably S—$C_1$-$C_4$alkyl.

$C_{6-12}$Arylthio is S—$C_{6-12}$aryl, for example phenylthio or naphthylthio, preferably phenylthio.

$C_{2-12}$Dialkylamino is N(alkyl$_1$)(alkyl$_2$), the sum of the carbon atoms in the two groups alkyl$_1$ and alkyl$_2$ being from 2 to 12, and is especially N($C_1$-$C_4$alkyl)—$C_1$-$C_4$alkyl.

$C_{7-18}$Alkylarylamino is N(alkyl$_1$)(aryl$_2$), the sum of the carbon atoms in the two groups alkyl$_1$ and aryl$_2$ being from 7 to 18, and is especially methylphenylamino or ethylphenylamino.

$C_{12-24}$Diarylamino is N(aryl$_1$)(aryl$_2$), the sum of the carbon atoms in the two groups aryl$_1$ and aryl$_2$ being from 12 to 24, and is, for example, diphenylamino or phenylnaphthylamino, especially diphenylamino.

The soluble derivatives are preferably those of the preferred pigments mentioned above. Quite unexpectedly,

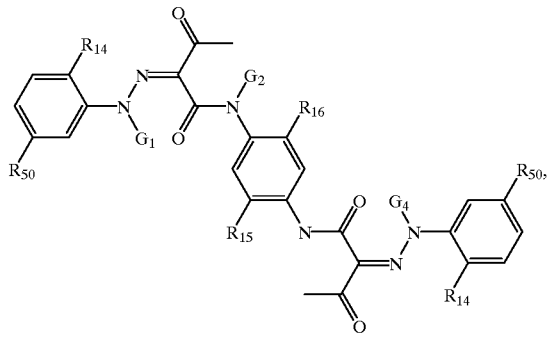

(XVI)

wherein $R_{50}$ is hydrogen, chloro, CONG$_5$R$_{17}$ or SO$_2$NG$_5$R$_{17}$,
$G_1$ to $G_5$ are each independently of one another hydrogen or a —CO$_2$B group, at least one of $G_1$ to $G_5$ not being hydrogen, and
$R_{14}$ to $R_{17}$ and B are as defined above.

Preference is given to a compound of formula

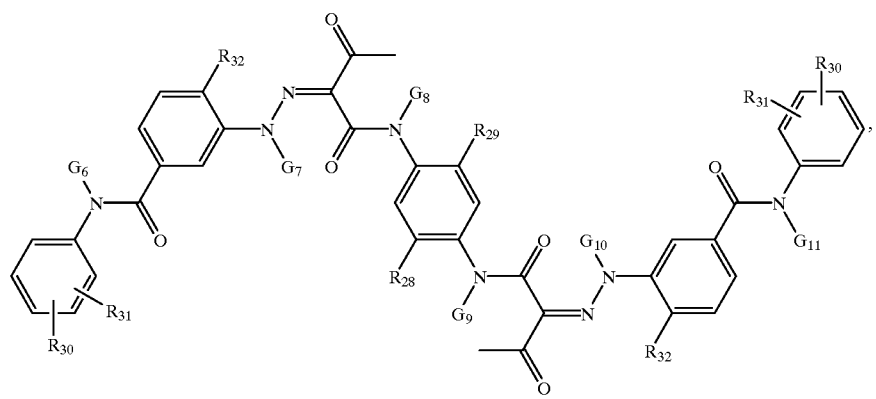

(XVII)

wherein $G_6$ to $G_{11}$ are each independently of one another hydrogen or a —CO$_2$B group, at least one of $G_6$ to $G_{11}$ not being hydrogen, and
$R_{28}$ to $R_{31}$ and B are as defined above.

With two exceptions, the soluble derivatives of benzimidazaloneazo pigments of formulae (VIIIa) and (VIIIb) are novel, too. This invention therefore also relates to a compound of formula however, it has been found that surprisingly good results are obtained using, in particular, soluble derivatives of disazo pigments of formula (VI). Accordingly, the soluble derivatives of pigments of formula (VI) are particularly preferred, especially those of formula (XIII).

The soluble derivatives of disazo pigments of formula (VI) are novel. This invention therefore also relates to a compound of formula

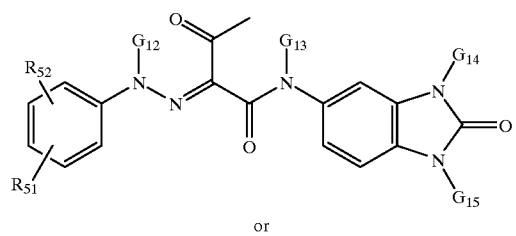

(XVIIIa)

or

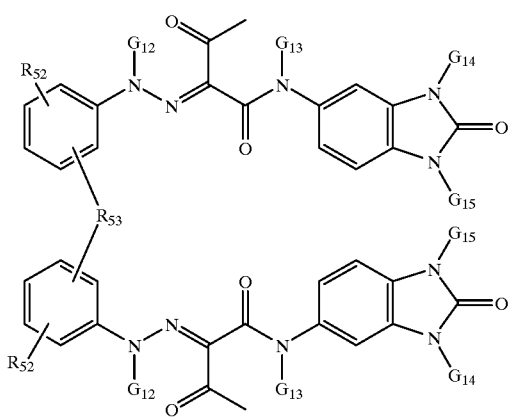

(XVIIIb)

wherein $R_{51}$, and $R_{52}$ are each independently of the other hydrogen, halogen, nitro, $C_1$-$C_6$alkoxy, trifluoromethyl, $C_1$-$C_6$alkyl, carboxy, $C_1$-$C_6$alkoxycarbonyl or $CONG_{16}R_{54}$, $R_{53}$ is a direct bond, oxygen, sulfur, $C_1$-$C_6$alkylene or O—$C_2$-$C_6$alkylene—O, $R_{54}$ is hydrogen, $C_1$-$C_6$alkyl or phenyl which is unsubstituted or substituted by halogen, nitro, $C_1$-$C_6$alkoxy, trifluoromethyl, $C_1$-$C_6$alkyl, carboxy, $C_1$-$C_6$alkoxycarbonyl or $CONG_{17}G_8$, and $G_{12}$ to $G_{18}$ are each independently of one another hydrogen or a —$CO_2B$ group, at least one of $G_1$ to $G_5$ not being hydrogen, with the proviso that when in formula (XVIIIa) $R_{51}$ is H, $R_{52}$ is o-$CF_3$, and $G_{14}$ and $G_{15}$ are $COOC(CH_3)_2CH_2O(CH_2)_2OCH_3$, $G_{12}$ and $G_{13}$ are not both hydrogen or both $COOC(CH_3)_2CH_2O(CH_2)_2OCH_3$.

Preferred are the compounds of formula (XVI), (XVII) or (XVIIIa), particularly preferred of formula (XVI) or (XVII), very particularly preferred of formula (XVII).

The compounds of formulae (XVI), (XVII), (XVIIIa) and (XVIIIb) have an advantageously low inherent colour. They can be prepared analogously to the process described above. The compounds of formulae (XVI), (XVII), (XVIIIa) and (XVIIIb), wherein one or several, but not all, $G_1$ to $G_{18}$ are hydrogen, is usually obtained in the form of mixtures which can be separated by usual methods into their individual components or, preferably, which can be further used without any separation. Preferred compounds are those of formula (XVI) or (XVII), wherein $G_1$ to $G_4$, or $G_6$ to $G_{11}$, are each a $CO_2B$ group.

The position of groups $G_1$, $G_4$, $G_7$, $G_{10}$ and $G_{12}$ is not definitely known. It cannot be excluded that some are in tautomeric position, for example at the oxygen atom of an acetyl group.

The compounds of formula (XVI), (XVIIIa) or (XVIIIb) can by used for any purposes. It is preferred to use them, however, as pigment precursors, the novel soluble compounds of formula (XVI), (XVIIIa) or (XVIIIb) incorporated in a substrate being converted to the corresponding pigments, all $G_1$ to $G_4$ or $G_{12}$ to $G_{18}$ being removed and replaced with hydrogen.

This can be achieved in very easy manner by thermally treating (heating to the temperature range from 50 to 250° C., preferably from 100 to 200° C., depending on the pigment) the solids, solutions or dispersions containing the soluble pigment derivatives in organic or aqueous media, polymer solutions or melts, in particular the structured high molecular weight organic materials comprising the novel soluble compounds. The presence of a catalyst, for example an acid, may be found to be advantageous for thermally converting the soluble pigment derivatives back to the pigments.

This permits to colour paint systems, printing inks, plastics, in particular also in fibre form, heat-sensitive recording systems, inks for ink jet printing, ink ribbons for thermal dye diffusion printing on smooth or woven recipient substrates as well as, most particularly, photosensitive compositions, for example negative or positive resist formulations, with on the whole improved properites, such as purity, colour strength, brilliance and transparency, as well as interesting applications in analytics.

In another of its aspects, this invention therefore relates to a high molecular weight organic material, which comprises in the mass a pigment produced in situ by thermal degradation of a soluble compound of formula (XVI), (XVIIIa) or (XVIIIb).

Other objects of this invention are a thermo-, photo- or chemo-sensitive recording material, an ink for ink jet printing, an ink ribbon of thermal transfer printing or, in particular, a photostructurable material comprising a compound of formula (XVI), (XVIIIa) or (XVIIIb). This compound is usefully distributed in fine form (for example dispersed, suspended or emulsified) or dissolved in the recording material, in the ink, in the ink ribbon or in the photostructurable material.

The skilled person is very familiar with inks for ink jet printing, ink ribbons for thermal transfer printing, thermo-, photo- and chemo-sensitive recording materials and also photostructurable photosensitive negative or positive resist compositions. The low inherent colour of the compound of formula (XVI), (XVII), (XVIIIa) or (XVIIIb) is particularly advantageous in these applications because the latent pigments remain invisible.

The soluble pigment derivatives are converted back to the pigments during or, preferably, after structuring the radiation-sensitive precursor to the high molecular weight material.

The novel black-pigmented high molecular weight organic materials have high opacity for visible light in the range from 400 to 700 nm. They are excellently suitable for the preparation of black matrices, for example such as are used in colour filters.

The novel colour filters can be used with excellent results in liquid crystal displays, plasma displays or electroluminescent displays. These may be, for example, active (twisted nematic) or passive (supertwisted nematic) ferroelectric displays or light-emitting diodes.

Accordingly, this invention also relates to a process for pattern-wise masking a visible light beam by absorption using a black patterned medium, which process comprises directing a light beam on a novel black-pigmented high molecular weight organic material which is coated on a transparent substrate. Owing to the steep edge, only transparent and black zones are essentially obtained with virtually no undesirable gray edge zones in between.

The invention is illustrated by the following Examples:

EXAMPLE 1

140 g of copper phthalocyanine are introduced, under nitrogen, into 582 ml of chlorosulfonic acid in a 1.5 litre multi-necked flask equipped with an anchor stirrer, thermometer, reflux condenser, inert gas supply and gas washer, and are stirred at 140° C. for 3 h. The dark green solution is then cooled to 85° C., 176 ml of thionyl chloride are added dropwise over a period of 15 minutes and the mixture is stirred further at that temperature for 3 hours and is then left to cool overnight. The dark green solution is added dropwise, with stirring, to a mixture of 4 kg of water and 4 kg of ice, the temperature rising to 20° C. The blue suspension is then filtered and the residue is washed 3 times using 4 litres of water each time and dried with suction. The still moist crude sulfochlorinated copper phthalocyanine is used further immediately.

In a 6 litre multi-necked flask equipped with an anchor stirrer, thermometer, reflux condenser and nitrogen supply, a solution of 385 g of tert-butyl carbazate in 1 litre of tetrahydrofuran (THF) is poured, under nitrogen, into the crude sulfochlorinated copper phthalocyanine dissolved in 3 litres of THF, and the blue solution is stirred at room temperature for 1 h. The reaction solution is then concentrated as completely as possible by evaporation using a rotary evaporator and the blue pasty residue is dissolved in 2 litres of $CH_2Cl_2$; 1 litre of diethyl ether ($Et_2O$) is added and the mixture is slowly added dropwise, with vigorous stirring, to 14 litres of hexane. The fine precipitate is removed by filtration and dried well with suction. 317.9 g of a blue solid are obtained, which, according to thin-layer chromatography (silica gel/ethyl acetate=EtOac), contains the desired product ($R_f$=1.0) and a highly polar secondary product ($R_f$=0). The crude product is dissolved in 2 litres of EtOac and filtered in order to separate it from the insoluble whitish blue solid. The filtrate is concentrated by evaporation to 1.2 litres and filtered with 6 litres of EtOac over 2.5 kg of silica gel on a suction-filter (layer thickness 5 cm). The fractions that contain the nonpolar product are combined and concentrated by evaporation. The residue is dissolved in 500 ml of $CH_2Cl_2$; 150 ml of $Et_2O$ are added and the mixture is slowly added dropwise, with vigorous stirring, to 6.5 litres of hexane. The precipitate is removed by filtration, washed 3 times with 500 ml of hexane each time and dried at 60° C./160 mbar for 28 hours. 153.7 g of blue powdery tert-butyl-N-hydrazinecarboxylate-substituted copper phthalocyanine are obtained.

Thermogravimetric analysis shows a weight loss of 51.9% with a mid-point of 172° C.

UV/VIS (NMP=N-methylpyrrolidone): $\lambda_{max}$=673 nm, $\epsilon$=153 820 l.mol$^{-1}$.cm$^{-1}$;

Analysis [%]: calc. C 46.17 H 4.17 N 16.57 S 9.48 Cl 0.00 ($C_{52}H_{56}CuN_{16}O_{16}S_4$) found C 46.05 H 4.42 N 16.02 S 8.54 Cl 0.53.

EXAMPLE 2

13.5 g of ethyl chloroacetate and 18.2 g of powdered potassium carbonate are refluxed in 60 ml of acetone for 16 hours. The mixture is left to cool to room temperature, is filtered and washed with hexane. The filtrate is concentrated using a rotary evaporator, there being obtained in a practically quantitative yield the compound of formula

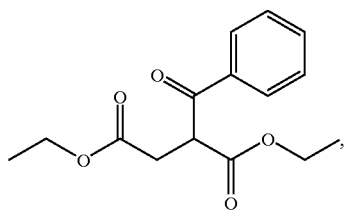

which is used further in the form of a crude product.

That crude product and 78.5 g of ammonium acetate are refluxed in 90 ml of glacial acetic acid for 2 hours. The mixture is poured into ice/water and the precipitated crude product is isolated by filtration. Recrystallisation from ethanol/water yields 15.3 g (60% of theory) of the crystalline pyrrolinone of formula

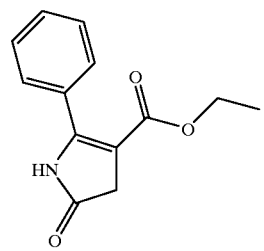

having a melting point of 173–176° C.

Analysis [%]: calc. C 67.52 H 5.67 N 6.06 ($C_{13}H_{13}NO_3$) found C 67.52 H 5.71 N 5.90.

4.35 g of sodium and 0.05 g of sulfosuccinic acid bis-2-ethylhexyl ester sodium salt are stirred at reflux temperature in 100 ml of tert-amyl alcohol until the reaction is complete. 12 g of 4-tert-butylbenzonitrile are added at 95° C. to the clear solution and then 14.6 g of the pyrrolinone obtained above are added in portions over a period of 30 minutes. The reaction mixture is stirred at 100° C. for 3 hours. The reaction mixture is then cooled to room temperature and introduced into a mixture of 15.8 ml of 37% HCl and 600 ml of methanol and subsequently stirred at room temperature for 2 hours. The red mixture is isolated by filtration, washed with methanol and then with water and dried in vacuo at 60° C. 17.6 g (81% of theory) of the pigment of formula

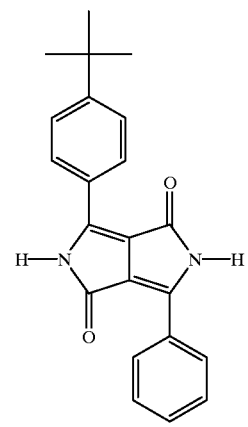

are obtained.

Analysis [%]: calc. C 76.72 H 5.85 N 8.13 ($C_{22}H_{20}N_2O_2$) found C 76.47 H 5.72 N 8.10.

EXAMPLE 3

37 g of di-tert-amyl dicarbonate and then 2.93 g of 4-dimethylaminopyridine are added to a suspension of 20.7 g of the product according to Example 2 in 600 ml of THF. The reaction mixture is stirred at room temperature for 4 hours. The solvent is then distilled off under reduced pressure. The residue is washed with methanol and dried in vacuo at room temperature, giving 31.3 g (91% of theory) of a bright yellow product of formula:

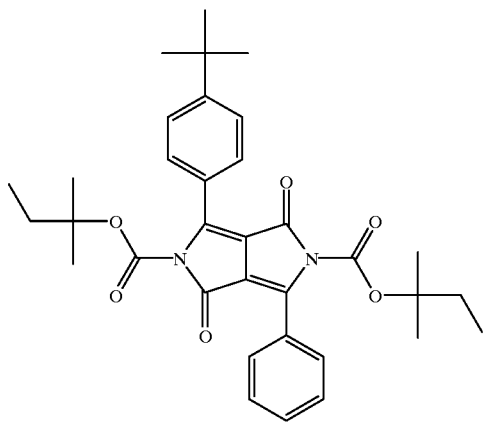

are obtained.

Analysis [%]: calc. C 71.31 H 7.04 N 4.89 ($C_{34}H_{40}N_2O_6$) found C 71.28 H 6.95 N 4.74.

EXAMPLE 4

The procedure of Example 3 is repeated, but using di-tert-butyl-dicarbonate instead of di-tert-amyl-dicarbonate.

EXAMPLE 5

A suspension of 72.7 g of C.I. Pigment Violet 37 in 1500 ml of THF is charged with a solution of 3.9 g of dimethylaminopyridine and 49.25 g of di-tert-amyl-dicarbonate in 100 ml of THF. After stirring this mixture overnight at 23° C., a solution of 49.25 g of di-tert-amyl-dicarbonate in 100 ml of THF is added and the mixture is stirred overnight. The reaction mixture is filtered through kieselguhr (®Celite Filter Cel, Fluka) and the filtrate is concentrated to dryness by evaporation. The residue is suspended in 300 ml of n-hexane, filtered and concentrated to dryness by evaporation, giving 86 g of the red compound of formula:

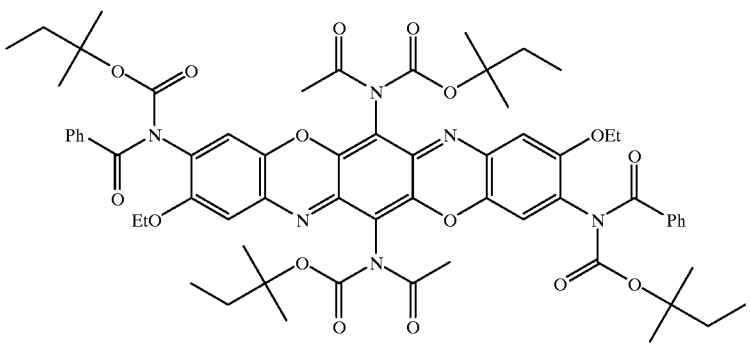

Analysis [%]: calc. C 64.96 H 6.30 N 7.10 ($C_{64}H_{74}N_6O_{16}$) found C 65.11 H 6.36 N 6.99;
$^1$H-NMR (CDCl$_3$, 300MHz) δ: 7.69 (d,4H); 7.45 (t,2H); 7.35 (t,4H); 6.97 (s,1H); 6.96 (s,1H); 6.95 (s,1 H); 6.94 (s,1 H); 4.00 (q,4H); 2.60 (m,6H); 1.10–1.70 (m,30H); 0.60 (m,12H).

EXAMPLE 6

A suspension of 100 g of C.I. Pigment Yellow 93 in 1500 ml THF is charged with 10.46 g of dimethylaminopyridine (DMAP) and 186.8 g of the di-tert-butyldicarbonate. After stirring overnight at room temperature, the reaction mixture is filtered through kieselguhr and the filtrate concentrated. Addition of hexane to the residue and vigorous stirring followed by filtration, yields 176.2 g of crude product which is further chromatographed on silica (CH$_2$Cl$_2$/ EtOac). Evaporation of the appropriate fractions yields a crude product which is further dissolved in methanol. Addition of this methanolic solution to water followed by filtration results in 155.1 g (94%) of the pure, very pale product of formula

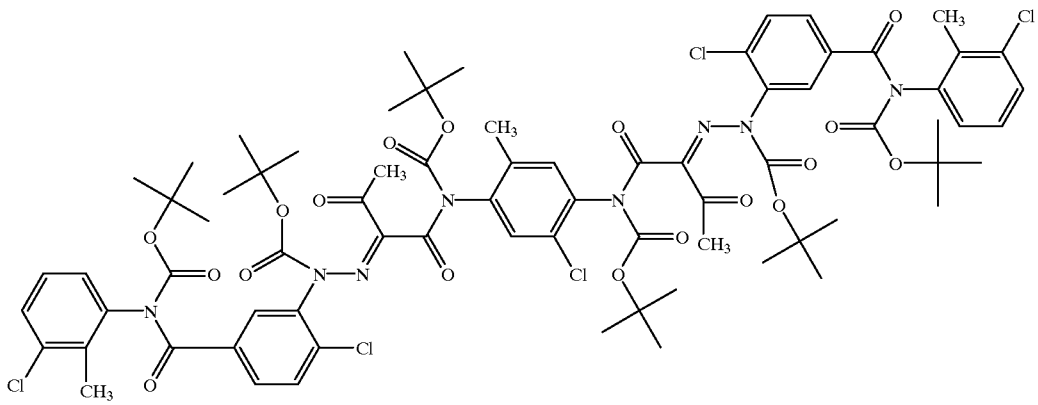

Analysis [%]: calc. C 57.02 H 5.44 N 7.29 Cl 11.53 ($C_{73}H_{83}Cl_5N_8O_{18}$) found C 56.72 H 5.49 N 6.92 Cl 10.84.

Thermogravimetrical analysis shows a weight loss of 39.5% with a mid-point of 159° C.

EXAMPLE 7

A suspension of 10 g of C.I. Pigment Yellow 128 in 250 ml THF is charged with 0.61 g of DMAP and 11 g of di-tert-butyldicarbonate. After stirring overnight at room temperature, the reaction mixture is filtered through kieselguhr and the filtrate concentrated. Addition of hexane to the residue and vigorous stirring followed by filtration, yields 14.7 g of crude product which is further chromatographed on silica ($CH_2Cl_2$/EtOac). Evaporation of the appropriate fractions yields a crude product which is further suspended in hexane. Filtration and drying result in 8.0 g (52%) of the pure, very pale product of formula

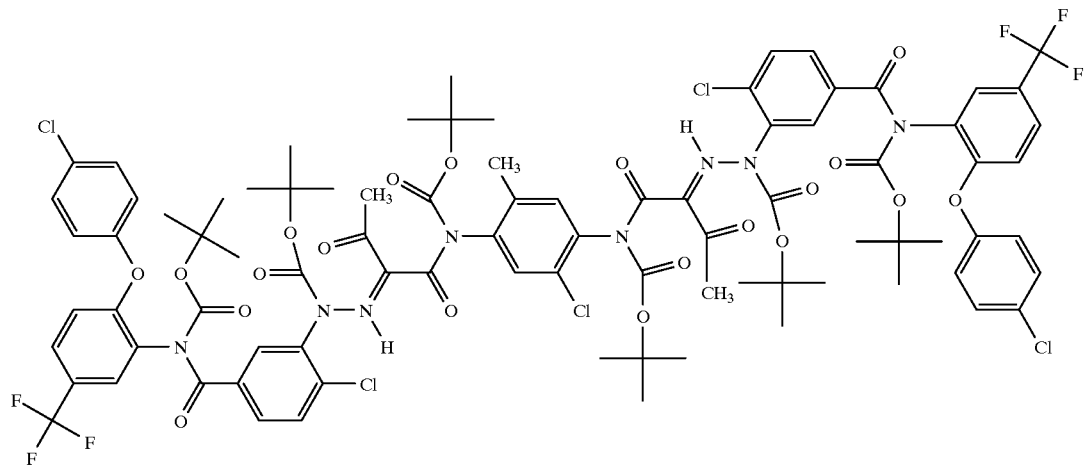

Analysis (%): calc. C 55.79 H 4.68 N 6.12 Cl 9.69 ($C_{85}H_{85}Cl_5F_6N_8O_{20}$) found C 56.08 H 4.85 N 6.07 Cl 9.43. Thermogravimetrical analysis shows a weight loss of 35.6% with a mid-point of 173° C.

EXAMPLE 8

A formulation is prepared by dissolving 60 g of ™PHM-C resin (Maruka Lyncur, $M_w$=5300), 20 g of ™Cymel 300 (cyanamide), 40 g of ™Trisp-PA (Mitsui), 5 g of 2-(2-(4-methoxyphenyl)ethenyl)-4,6-bis(trichloromethyl)-1,3,5-triazine, 60 g of the solubilised pigment according to Example 1 and 50 g of the solubilised pigment according to Example 3 in 500 g of cyclopentanone.

A 3.8 μm thick film is obtained by spin-coating at a speed of 600 rpm onto a 7.5×7.5 cm glass plate (Corning type 7059) and by subsequent drying on a hot-plate at 100° C. for 1 minute. The UV/VIS spectrum of this film has a 58% transmission at 510 nm.

The film is exposed image-wise through a mask by means of a ™UXM-502 MD lamp (500 watts, Ushio) for 1 minute and is then heated at 100° C. for 1 minute on a hot-plate. Developing is then carried for 30 seconds in a developer solution consisting of 2.38 % by weight of tetramethylammonium hydroxide and 2% by weight of ™FC430 (3M) dissolved in water, the previously exposed areas of the film remaining whilst the unexposed areas are dissolved away. Finally, the structured glass plate is heated at 230° C. for 5 minutes on a hot-plate. Patterned film structures of a deep black colour are obtained.

The UV/VIS spectrum has a very deep transmission at 300 to 700 nm.

EXAMPLE 9

A formulation is prepared by dissolving 42.3 g of ™PHM-C resin (Maruka Lyncur, $M_w$=5300), 8.5 g of ™Cymel 300 (cyanamide, twice distilled), 1.7 g of ™Triazine A (Produits Chimiques Auxiliaires et de Synthése, Longjumeau, France), 34 g of the solubilised pigment according to Example 1, 34 g of the solubilised pigment according to Example 4, 17 g of the solubilised pigment according to Example 5 and 34 g of the solubilised pigment according to Example 6 in 254 g of cyclopentanone (™OMM HTR-2D, Olin-Hunt). This formulation is mixed for several hours in the dark and is then filtered through a microfilter having a pore width of 1 μm.

A thin film is obtained by spin-coating at a speed of 3000 rpm (30 s) onto a 7.5×7.5 cm glass plate (Corning Typ 1737) and by subsequent drying on a hot plate at 100° C. for 2 min.

This film is exposed image-wise through a mask by means of a UV light source (0.75 mW/cm²—G, H and I lines) for 267 seconds and is then heated at 100° C. for 2 min on a hot-plate. Developing is then carried out for 5 min in an aqueous developer solution consisting of 2.38 % by weight of tetramethylammonium hydroxide and 2% by weight of a neutral wetting agent (polyglycol-substituted aromatic compound), rinsed with water and dried, only the exposed zones of the films remaining. Finally, the glass plate is heated on a hot-plate for 5 min at 200° C. Patterned film structures having excellent resolution and a deep black colour are obtained which have an optical density of 3 and a thickness of about 2.2 μm.

EXAMPLE 10

The general procedure of Example 9 is repeated, but developing is carried out for 1 min with mild stirring (≈500 rpm). The result is satisfactory.

EXAMPLE 11

A formulation is prepared by dissolving 8.20 g of a copolymer prepared from methacrylic acid and benzylmethacrylate by radical polymerisation (1% AIBN, toluene, 20 hours at 70° C., $M_n$=8500, $M_w$=35000), 3.6 g of dipentaerythritolmonohydroxypentaacrylate (™SR 399, Sartomer Inc.), 1.6 g of ™Triazine A (Produits Chimiques Auxiliaires et de Synthése, Longjumeau, France), 6.3 g of the solubilised pigment according to Example 4, 0.9 g of the solubilised pigment according to Example 5 and 1.4 g of the solubilised pigment according to Example 6 in 32.6 g of cyclopentanone (™OMM HTR-2D, Olin-Hunt) and by subsequent addition of a finely dispersed dispersion of 1.72 g of C.I. Pigment Blue 15:6 in 6.88 g of propylglycolmonomethylacetate (™RER 600, Olin-Hunt). This formulation is filtered through a microfilter having a pore width of 5 μm and then through a microfilter having a pore width of 1 μm.

A thin film is obtained by spin-coating at a speed of 700 rpm (30 s) onto a 7.5×7.5 cm glass plate (Corning Typ 1737) and by subsequent drying on a hot-plate at 100° C. for 2 minutes.

This film is exposed image-wise through a mask by means of a UV light source (1.5 mW/cm²—G, H and I lines) for 267 seconds and is then heated at 100° C. for 2 minutes on a hot-plate. Developing is then carried out, with stirring (≈1000 rpm), for 2½ min in an aqueous developer solution consisting of 2.38 % by weight of tetramethylammonium hydroxide and 2% by weight of a neutral wetting agent (polyglycol-substituted aromatic compound), and is then rinsed with water and dried, only the exposed zones of the film remaining. Finally, the glass plate is heated for 5 min on a hot-plate at 200° C. Patterned film structures having good resolution and a deep black colour are obtained which have an optical density of 1.7 and a thickness of about 2.1 μm.

EXAMPLE 12

A suspension of 10 g of C.I. Pigment Yellow 154 in 500 ml THF is charged with 1.75 g of DMAP and 35.4 g of di-tert-amyldicarbonate. After stirring overnight at room temperature, the reaction mixture is filtered on Kieselguhr and the filtrate concentrated. Dissolution of the residue in methanol followed by precipitation into water results in a precipitate which is filtered, again dissolved in $CH_2Cl_2$ and dried over $MgSO_4$. Filtration and evaporation of the filtrate yields a paste which is in turn triturated in methanol. Filtration and addition of the filtrate to water yields a precipitate which is filtered. The collected solid is then dissolved in $CH_2Cl_2$ and the solution dried over $MgSO_4$. After filtration and evaporation of the solvent, the solid is chromatographed on silica gel, eluting with $CH_2Cl_2$/EtOAc. Evaporation of the appropriate fractions yields a solid which is dissolved in methanol and precipitated in water. Filtration and drying provides 15.6 g (73%) of the pure, very pale product of formula

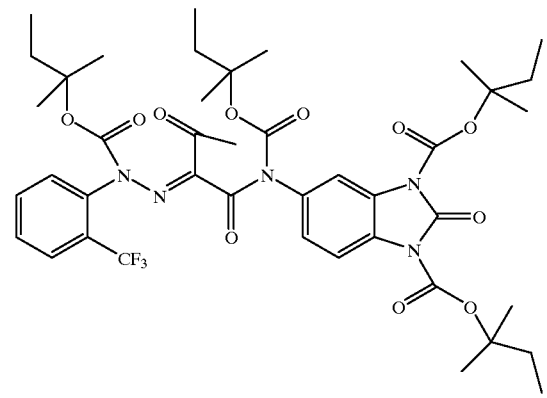

Analysis [%]: calc. C 58.53 H 6.31 N 8.13 ($C_{85}H_{89}Cl_5F_6N_8O_{20}$) found C 58.80 H 6.30 N 8.63.

Thermogravimetrical analysis shows a weight loss of 49.5% with a mid-point of 153° C.

EXAMPLE 13

A formulation is prepared by dissolving 42.3 g of ™PHM-C resin (Maruka Lyncur, $M_w$=5300), 8.5 g of ™Cymel 300 (cyanamide, twice distilled), 1.7 g of ™Triazine A (Produits Chimiques Auxiliaires et de Synthése, Longjumeau, France), 34 g of the solubilised pigment according to Example 1, 34 g of the solubilised pigment according to Example 4, 17 g of the solubilised pigment according to Example 5 and 34 g of the solubilised pigment according to Example 12 in 254 g of cyclopentanone (™OMM HTR-2D, Olin-Hunt). This formulation is mixed for several hours in the dark and is then filtered through a microfilter having a pore width of 1 μm.

A thin film is obtained by spin-coating at a speed of 1250 rpm (30 s) onto a 7.5×7.5 cm glass plate (Corning Typ 1737) and by subsequent drying on a hot plate at 100° C. for 2 min.

This film is exposed image-wise through a mask by means of a UV light source (0.75 mW/cm²/ G, H and I lines) for 267 seconds and is then heated at 100° C. for 2 min on a hot-plate. Developing is then carried out for 5 min in an aqueous developer solution consisting of 2.38% by weight of tetramethylammonium hydroxide and 1% by weight of a neutral wetting agent (polyglycol-substituted aromatic compound), rinsed with water and dried, only the exposed zones of the films remaining. Finally, the glass plate is heated on a hot-plate for 5 min at 200° C. Patterned film structures having excellent resolution and a deep black colour are obtained which have an optical density of 2.3 and a thickness of about 1.5 μm.

What is claimed is:

1. A structured pigmented high molecular weight organic material, which is obtained by irradiating a radiation-sensitive precursor, wherein the radiation-sensitive precursor
comprises at least one dissolved pigment derivative which can be converted to a coloured organic pigment which has an average particle size of ≦1.0 μm and
has a transmission of ≧10% at a wavelength in the range of at least 300 to 700 nm; and the structured material has a transmission of ≦5% throughout the entire range from 400 to 700 nm either in those places exposed to irradiation or in those not exposed to irradiation.

2. A pigmented material according to claim 1, wherein the radiation-sensitive precursor has a transmission of ≧20%.

3. A pigmented material according to claim 2, wherein the radiation-sensitive precursor has a transmission of ≧50%.

4. A pigmented material according to claim 1, wherein the structured material has a transmission of ≦2% in the entire range from 400 to 700 nm.

5. A pigmented material according to claim 1, wherein the pigment derivative can be converted to a coloured organic pigment selected from the group consisting of diketopyrrolopyrrole, dioxazine, diazo, benzimidazoloneazo, isoindoline, isoindolinone and phthalocyanine pigments.

6. A pigmented material according to claim 5, wherein the pigment derivative can be converted to a coloured organic pigment selected from the group consisting of pyrrolo[3,4-c]pyrroles of formula (I)

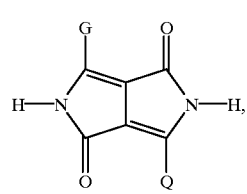

wherein G and Q are each independently of the other a group of formula

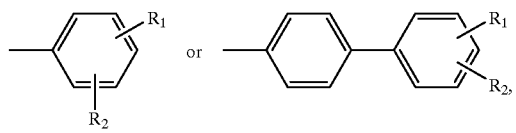

and $R_1$ and $R_2$ are each independently of the other hydrogen, halogen, cyano, carbamoyl, nitro, trifluoromethyl, phenyl, $C_1$–$_6$alkyl, $C_1$–$_6$alkoxy, $C_1$–$_6$alkylthio or $C_1$–$_6$alkylamino; dioxazines of formula (II)

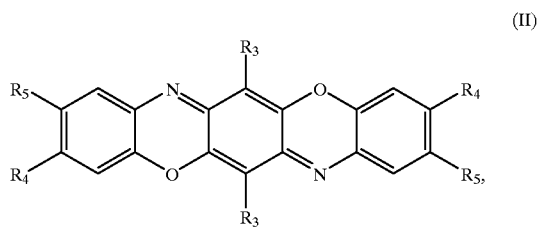

wherein $R_3$, $R_4$ and $R_5$ are each independently of one another hydrogen, halogen, $C_1$–$C_4$alkyl, $C_1$–$_4$alkoxy, NHCOC$_1$—$_4$alkyl or NHCOphenyl, at least 1 of the radicals $R_3$, $R_4$ or $R_5$ being NHCOC$_1$–$C_4$alkyl or NHCOphenyl; isoindolines of formula (III)

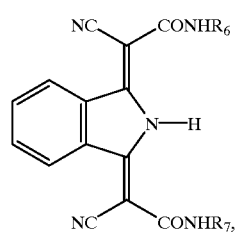

(IV)

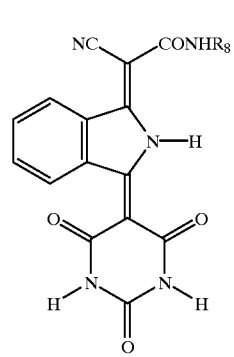

or

-continued

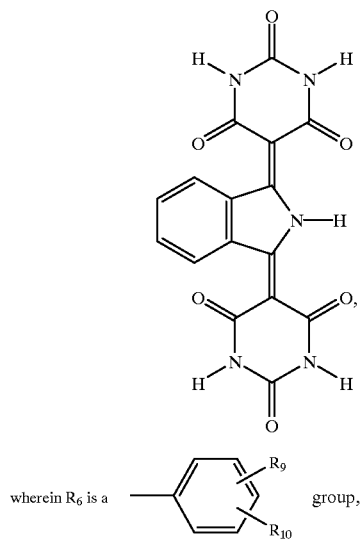
(V)

wherein R₆ is a 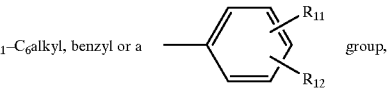 group,

R₇ is hydrogen, C₁–C₆alkyl, benzyl or a ──⟨⟩ group,

R₈ is hydrogen or R₆, and

R₉, R₁₀, R₁₁ and R₁₂ are each independently of one another hydrogen, C₁₋₆alkyl, C₁–C₆alkoxy, halogen or trifluoromethyl;

disazos of formula

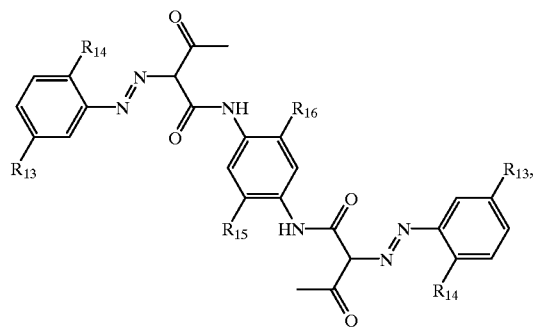
(VI)

wherein R₁₃ and R₁₄ are each independently of the other hydrogen, chloro, CONHR₁₇ or SO₂NHR₁₇, R₁₅ and R₁₆ are hydrogen, chloro or methyl, and R₁₇ is phenyl or oxybisphenyl, each of which is unsubstituted or substituted by 1 to 3 substituents selected from the group consisting of chloro, trifluoromethyl, methoxy and methyl;

benzimidazoloneazos of formula

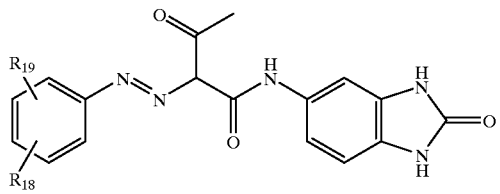
(VIIa)

or

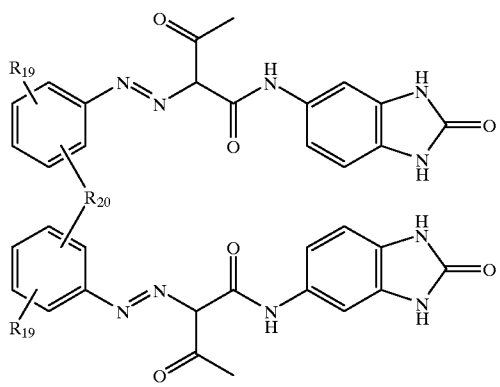
(VIIb)

wherein R₁₉ and R₁₈ are each independently of the other hydrogen, halogen, nitro, C₁₋₆alkoxy, trifluoromethyl, C₁₋₆alkyl, carboxy, C₁₋₆alkoxycarbonyl or CONHR₂₁, R₂₀ is a direct bond, oxygen, sulfur, C₁₋₆alkylene or O—C₂₋₆alkylene—O, and R₂₁ is hydrogen, C₁₋₆alkyl or phenyl which is unsubstituted or substituted by halogen, nitro, C₁₋₆alkoxy, trifluoromethyl, C₁₋₆alkyl, carboxy, C₁₋₆alkoxycarbonyl or CONH₂;

isoindolinones of formula

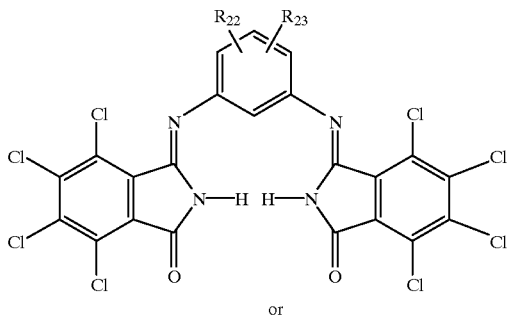
(VIIIa)

or

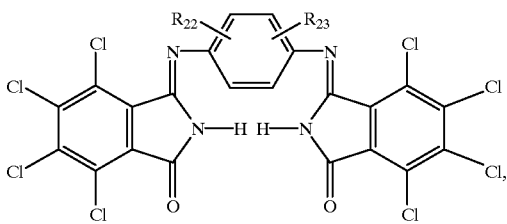

(VIIIb)

wherein $R_{22}$ and $R_{23}$ are each independently of the other hydrogen, halogen or $C_{1-6}$alkyl; and phthalocyanines of formula (IX)

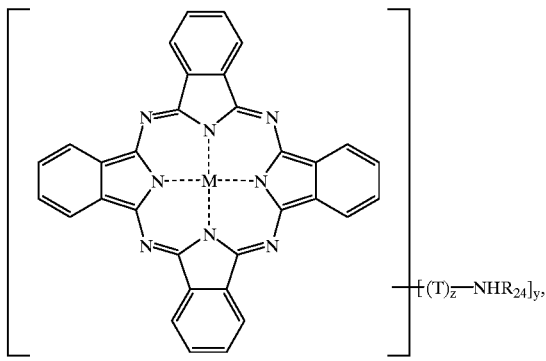

wherein M is $H_2$, a divalent metal selected from the group consisting of Cu(II), Zn(II), Fe(II) Ni(II) and Pd(II), or a divalent oxometal selected from the group consisting of V(O), Mn(O) and Ti(O), T is —$CHR_{25}$—, —CO— or —$SO_2$—, $R_{24}$ is hydrogen, $C_{1-6}$alkyl, $NH_2$, $NHCOR_{26}$, —$COR_{26}$ or

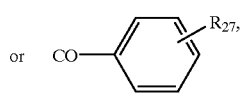

$R_{25}$ is hydrogen or $C_{1-6}$alkyl, $R_{26}$ is $C_{1-6}$alkyl, $R_{27}$ is hydrogen, halogen, $C_1$–$C_6$alkyl or $C_{1-6}$alkoxy, and z is zero or 1, and y is a number from 1 to 8, or of phthalocyanine derivatives resulting from the thermal or photochemical degradation of phthalocyanines of formula (IX).

7. A pigmented material according to claim 6, wherein the pigment derivative can be converted to a coloured organic pigment of formula (VI), wherein $R_{13}$ is $CONHR_{17}$ and $R_{14}$ is chloro.

8. A pigmented material according to claim 6, wherein the pigment derivative can be converted to a coloured organic pigment of formula (VI), wherein $R_{15}$ and $R_{16}$ are chloro or methyl.

9. A pigmented material according to claim 6, wherein the pigment derivative can be converted to a coloured organic pigment of formula (VI), wherein $R_{17}$ is phenyl or oxybisphenyl, each of which is substituted by 2 substituents selected from the group consisting of chloro, trifluoromethyl and methyl.

10. A pigmented material according to claim 1, which comprises several dissolved pigment derivatives which can be converted to coloured organic pigments.

11. A pigmented material according to claim 1, which additionally comprises one or several pigments in the form of insoluble particles.

12. A pigmented material according to claim 1, wherein the structured material has a transmission of ≦5% in the entire range from 400 to 700 nm at the places exposed to irradation.

13. A pigmented material according to claim 1, wherein the organic material comprises at least 5% by weight of pigment particles, based on the pigmented high molecular weight material.

14. A pigmented material according to claim 1, wherein the proportion of those pigments which are present in the radiation-sensitive precursor in the form of dissolved pigment derivatives is at least 30 mol %, based on the sum of all pigments in the structured material.

15. A pigmented material according to claim 6, wherein the proportion of those pigments which are present in the radiation-sensitive precursor in the form of dissolved pigment derivatives is at least 30 mol %, based on the sum of all pigments in the structured material.

16. A pigmented material according to claim 14, wherein the proportion of those pigments which are present in the radiation-sensitive precursor in the form of dissolved pigment derivatives is at least 50 mol %, based on the sum of all pigments in the structured material.

17. A pigmented material according to claim 1, wherein the pigment particles have an average particle size of 0.01 to 1.0 μm.

18. A pigmented material according to claim 17, wherein the pigment particles have an average particle size of 0.01 to 0.1 μm.

19. A pigmented material according to claim 1, wherein irradiation is carried out at 300 to 700 nm.

20. A pigmented material according to claim 1, which is coated on a transparent substrate as a thin layer of ≦5 μm.

21. A pigmented material according to claim 20, which is coated on a transparent substrate as a thin layer of ≦2 μm.

22. A process for the pattern-wise masking of a visible light beam by absorption via a black patterned medium, which comprises directing a light beam on an organic material according to claim 1 which is coated on a transparent substrate.

23. A process for the preparation of a patterned black matrix, which comprises structuring a composition, which is coated on a transparent substrate and which has a transmission of ≦10% at a wavelength in the range from 300 to 700 nm and which comprises a radiation-sensitive precursor and a dissolved pigment derivative which can be converted to a coloured organic pigment, by irradiating this composition in places at said wavelength and, if required, by additional thermal treatment;

treating the coating with a developer after structuring, such that essentially only high molecular weight organic material remains on the substrate either at the places exposed or not exposed to the irradiation; and converting the pigment derivative thermally, photochemically and/or by acid- or base-catalysation to a coloured organic pigment during or after structuring, such that the high molecular weight organic material remaining on the substrate has a transmission of <5% throughout the entire range from 400 to 700 nm.

* * * * *